United States Patent
Agarwala et al.

(10) Patent No.: US 7,279,411 B2
(45) Date of Patent: Oct. 9, 2007

(54) PROCESS FOR FORMING A REDUNDANT STRUCTURE

(75) Inventors: Birendra N. Agarwala, Hopewell Junction, NY (US); Du Binh Nguyen, Danbury, CT (US); Hazara Singh Rathore, Stormville, NM (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,223

(22) Filed: Nov. 15, 2005

(65) Prior Publication Data
US 2007/0111497 A1    May 17, 2007

(51) Int. Cl.
*H01L 21/4763* (2006.01)
(52) U.S. Cl. ............... 438/618; 257/E21.309; 257/E21.508; 438/627; 438/638
(58) Field of Classification Search .......... 438/653, 438/598, 614, 618, 623, 626, 648, 652, 627, 438/638; 257/E21.579
See application file for complete search history.

(56) References Cited

U.S. PATENT DOCUMENTS

| | | | |
|---|---|---|---|
| 6,376,353 B1 * | 4/2002 | Zhou et al. | ........... 438/612 |
| 6,383,929 B1 | 5/2002 | Boettcher et al. | |
| 6,429,519 B1 | 8/2002 | Uzoh | |
| 6,429,524 B1 | 8/2002 | Cooney, III et al. | |
| 6,433,429 B1 | 8/2002 | Stamper | |
| 6,539,625 B2 | 4/2003 | Engel et al. | |
| 6,720,253 B2 | 4/2004 | Wada et al. | |
| 6,806,578 B2 | 10/2004 | Howell et al. | |
| 7,030,016 B2 * | 4/2006 | Feng et al. | ........... 438/687 |
| 2002/0182855 A1 | 12/2002 | Agarwala et al. | |
| 2005/0098897 A1 | 5/2005 | Edelstein et al. | |
| 2006/0113675 A1 * | 6/2006 | Chang et al. | ........... 257/763 |

OTHER PUBLICATIONS

B. Li et al., *IEEE Transactions on Device and Materials reliability: Line Depletion Electromigration Characterization of Cu Interconnects*, Mar. 2004, vol. 4, No. 1, pp. 80-85.

D. Edelstein et al., *Proceedings of Advanced Metallization Conference 2001*, Oct. 21-31, 2001, pp. 541-547.

C.-K. Hu et al., *Applied Physics Letters: Mechanisms for very long electromigration lifetime in dual-damascene Cu interconnections*, Feb. 12, 2001, vol. 78, No. 7, pp. 904-906.

* cited by examiner

*Primary Examiner*—Michelle Estrada
*Assistant Examiner*—Jarrett J. Stark
(74) *Attorney, Agent, or Firm*—Joseph Petrokaitis; Greenblum & Bernstein, P.L.C.

(57) ABSTRACT

Device and method of fabricating device. The device includes a dual damascene line having a metal line and a via, and a redundant liner arranged to divide the metal line. The method includes forming a trench in a metal stripe of a dual damascene line, depositing a barrier layer in the trench, and filling a remainder of the trench with metal.

12 Claims, 10 Drawing Sheets

Prior Art

PROCESS FOR FORMING A REDUNDANT STRUCTURE

FIELD OF THE INVENTION

The present invention relates to an interconnect structure, e.g., an damascene interconnect, for integrated circuits with improved reliability and improved electromigration properties.

BACKGROUND DESCRIPTION

According to the known art, "fatwire" structure is a wiring layout laid out with a metal line having thicker height and wider width, e.g., thickness and pitch of 2×, 4×, 6×, etc. of a thin wire, minimum ground rules dimensions. However, with regard to electromigration effects, reliability of fatwire structures with a larger pitch becomes worse than in a thin wire structure. This inconsistent reliability is due to the fatwire structure. In this regard, fatwire failure generally occurs at the top of the metal line, i.e., near the surface of the stripe, and/or at the bottom of the interlevel via. In the known structure, the bottom of the via may not fully contact the sidewall liner. Moreover, even when the via contacts the sidewall liner, the liner is too thin to sustain all the current density of the fatwire.

A conventional process for forming a dual damascene line is shown in FIGS. 1-4. In particular, a trench 12 is formed in a substrate 11 into which a metal, e.g., copper or aluminum, is provided, e.g., via electroplating, in order to form metal line Mx and at least one via Vx. Substrate 11 may be, e.g., $SiO_2$, a low K organic material, a PCVD low dielectric material or other suitable material having a thickness of 400 to 2500 angstroms, metal line Mx may have a thickness in a range between 0.4-1.0 micron and a width of 0.2 to 1.0 micron, and via Vx may have a depth of 0.4 to 1.0 micron from the bottom of Mx and a diameter of 0.2 to 0.4 micron. Moreover, substrate 11 may optionally be covered by a hardmask layer 13, which can be, e.g., a PCVD oxide, SiCNH, SiC, $Si_3N_4$, or other suitable material. Moreover, the portion of hardmask 13 over trench 12 removed during the formation of trench 12 is filled with metal Mx. Further, metal line Mx is patterned by removing excess metal from the upper surface of substrate 11 or optional hardmask 13, e.g., through chemical mechanical polishing, to form a smooth upper surface.

In a next production step, a cap layer 14 is applied over the top of substrate 11/hardmask 13 and metal line Mx. Cap layer 14 can be, e.g., $SiN_x$, SiCNH, or other suitable cap layer material for metal line Mx, and have a thickness of 200-1000 angstroms. A substrate or interlevel layer 15 is deposited onto cap layer 14. Interlayer 15, like substrate 11, can be, e.g., $SiO_2$, a low K organic material, a PCVD low k-dielectric material or other suitable material having a thickness of 4000 (1×) to 24000 (6×). Optionally, a hardmask layer 16 can be deposited onto the surface of interlevel layer 15. Hardmask layer 16 can be, e.g., a PCVD oxide, SiCNH, or other suitable material with a thickness of 300-2000 angstroms.

In a next step in the conventional process, as shown in FIG. 2, a dual damascene trench 17 is formed in interlevel layer 15 and optional hardmask 16. Trench 17, which is formed by, e.g., lithography and etching, is composed of two portions: a first portion 18 extending to a depth of 0.6-2 micron from the surface of interlevel layer 15/hardmask 16 and a second portion 19 extending from first portion 18 down through cap layer 14 to contact metal line Mx.

As illustrated in FIG. 3, a liner 20 is deposited into trench 17 in order to form a barrier layer having a thickness of 50-500 angstroms. Liner 20 can be, e.g., Ta, TaN, W, Ti, TiN, or a combination of Ta, TaN, Ti, TiN, W or with other suitable material to act as a barrier layer for the metal to be deposited in liner 20. Moreover, liner 20 can be formed from one or more of the identified materials.

As noted above, and shown in FIG. 4, a metal, e.g., copper, is deposited in trench 17, and more particularly liner 20, in order to form metal line MQ in portion 18 of trench 17 and via VL in portion 19 of trench 17. Further, in accordance with the conventional process, wiring lines are patterned by removing excess metal from metal line MQ from the upper surface of substrate 15 or optional hardmask 16, e.g., through chemical mechanical polishing, to achieve a smooth upper surface with a metal stripe.

SUMMARY OF THE INVENTION

The present invention is directed to a method of fabricating a device. The method includes forming a trench in a metal stripe of a dual damascene line, depositing a barrier layer in the trench, and filling a remainder of the trench with metal.

Moreover, the present invention is directed to a device that includes a dual damascene line having a metal line and a via, and a redundant liner arranged to divide the metal line.

The instant invention is directed to a method for fabricating an interconnect structure. The method includes forming a trench in a substrate, depositing metal in the trench, forming a second trench in the metal, depositing a redundant liner in the second trench, and depositing metal in the second trench.

Still further, the invention is directed to a method of forming a redundant device that includes forming a redundant liner to divide a metal line of dual damascene line.

DETAILED DESCRIPTION OF EMBODIMENTS OF THE PRESENT INVENTION

The invention relates to a process for forming a wire from a conventional dual damascene line. According to the invention, the formed fatwire eliminates the line opens and improves reliability (electromigration) by providing a longer lifetime and tighter sigma than conventional fatwire structures.

According to the invention, the fatwire structure includes a thin redundant liner in the fatwire interconnect structure to isolate voids from underneath the via and to prevent such voids from propagating upward above the redundant liner. As a result, upward propagation of voids into the upper part of the metal layer is prevented.

The via opening is etched through the redundant liner, which increases the mechanical strength of the interconnect and essentially eliminates any thermal cycle and/or stress migration effects. Further, the depth of the via improves performance against the electromigration effects by increasing contact surface around the via.

Figure 1:
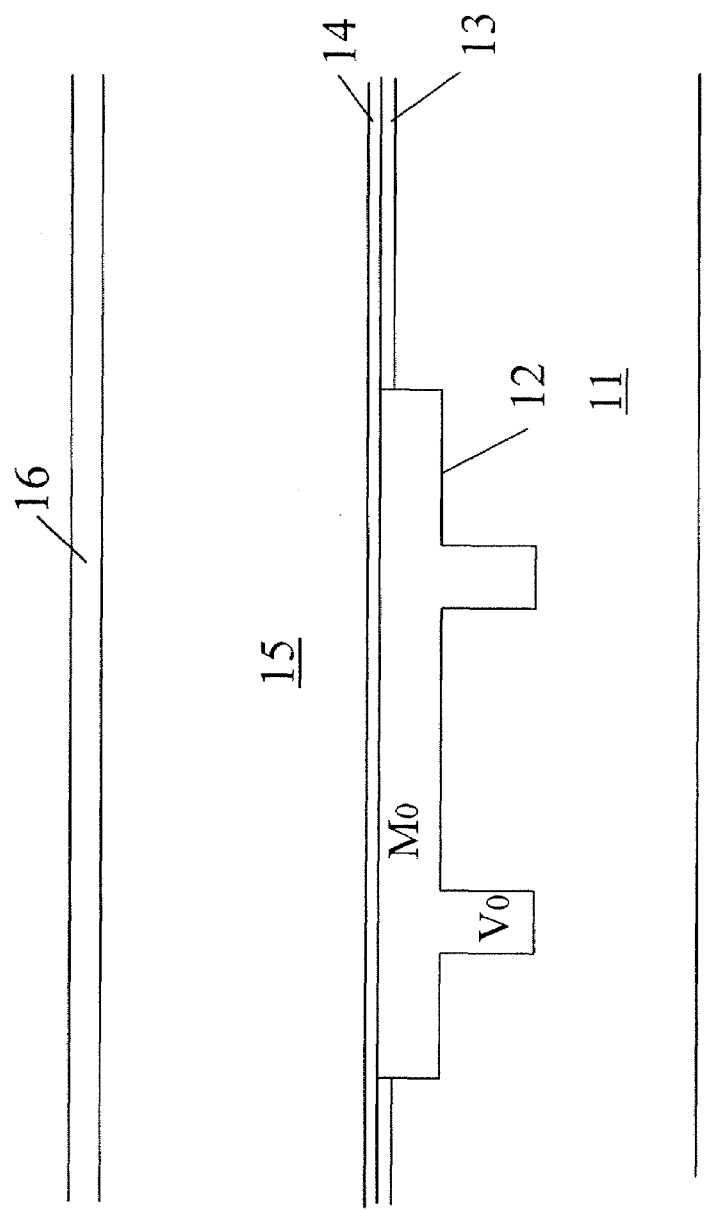
FIGS. 1-4 illustrate a conventional formation of a dual damascene line (prior arts)
Figure 2:
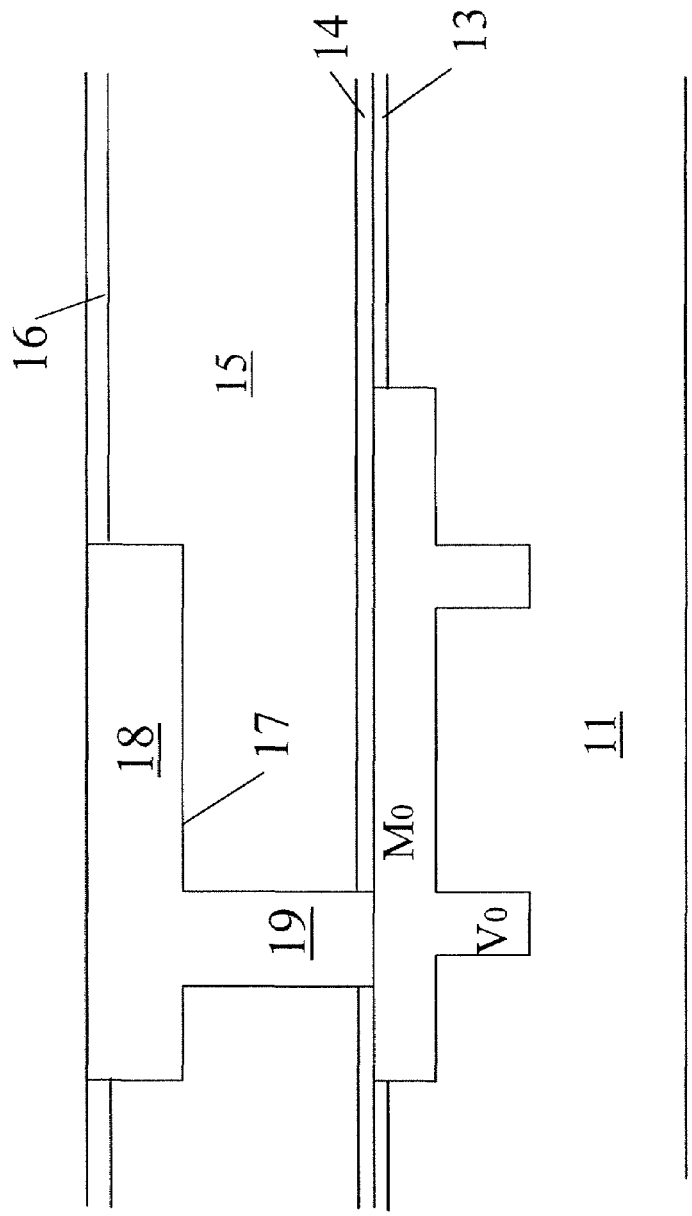
Figure 3:
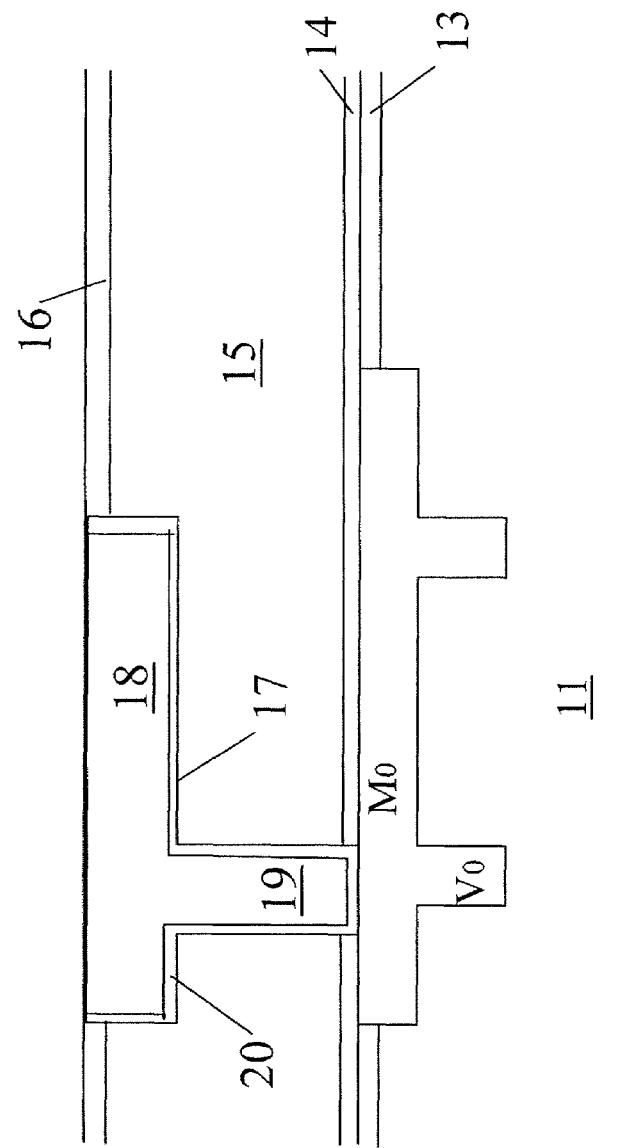
Figure 4:
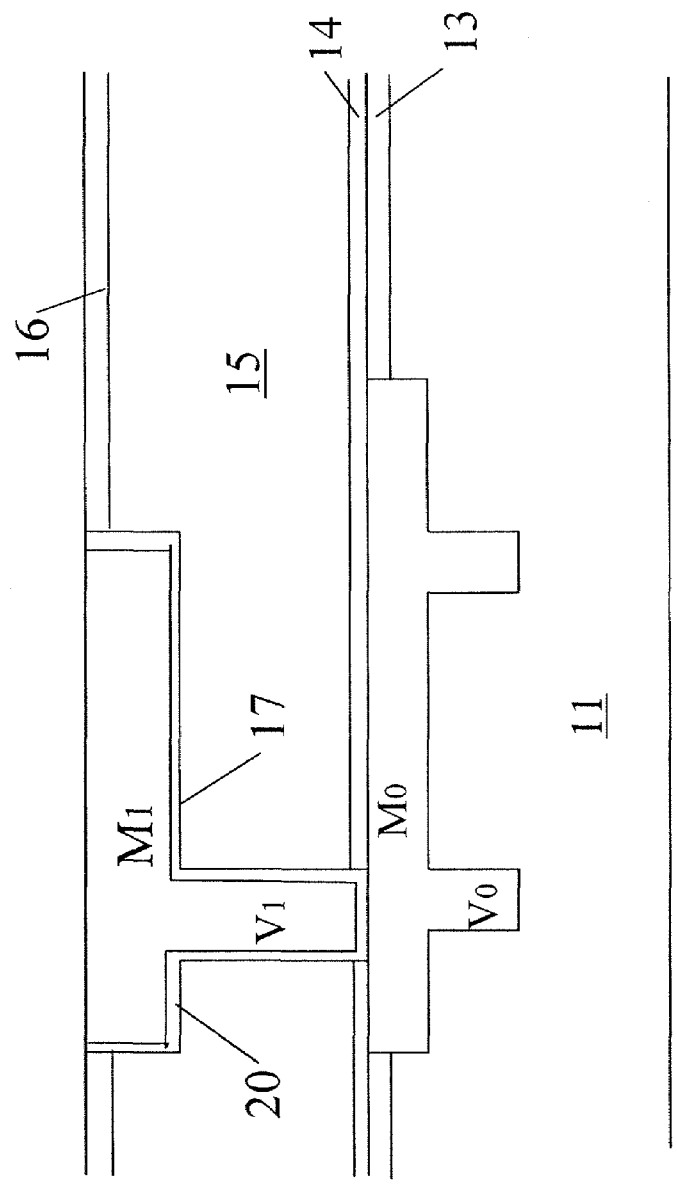
Figure 5:
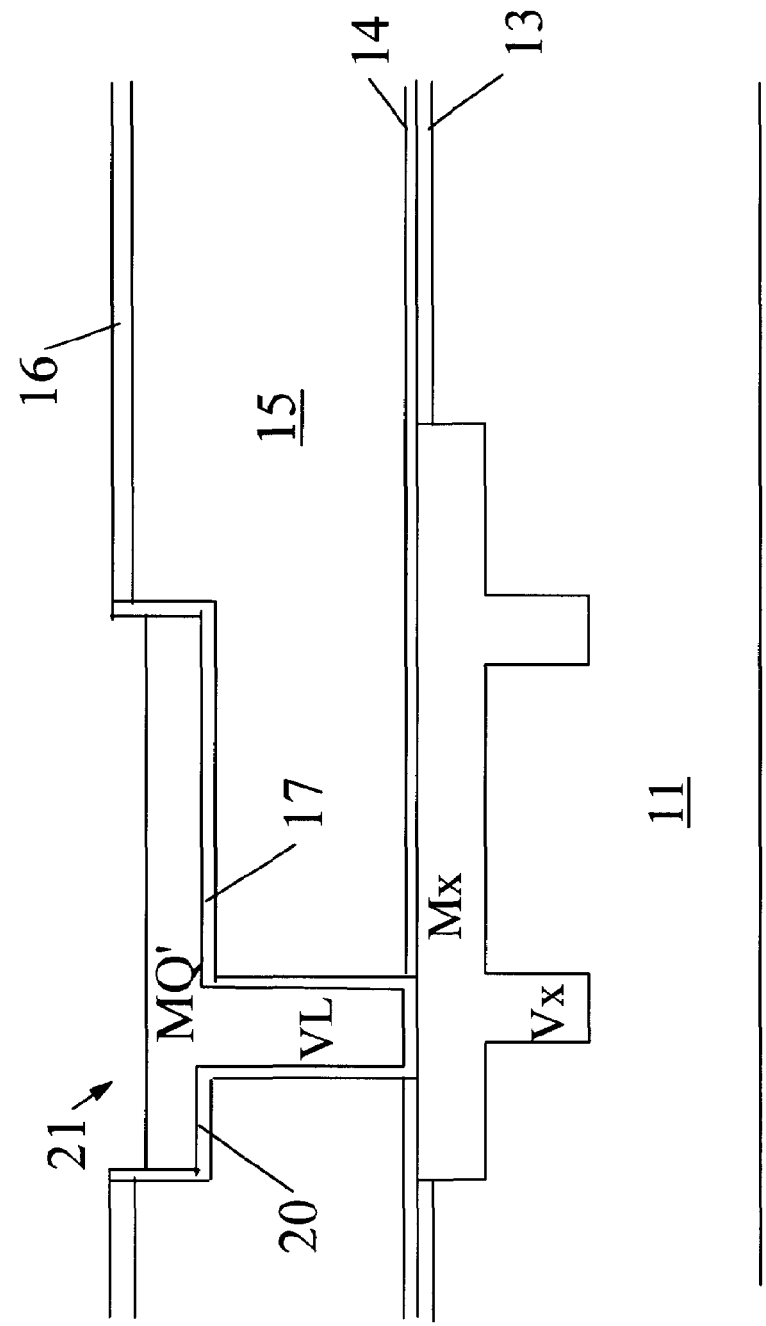
FIGS. 5-10 illustrate the formation of a redundant fatwire from the conventional dual damascene line depicted in FIG. 4 in accordance with the features of the present invention.

The present invention increases the reliability of the conventional dual damascene line shown in FIG. 4 by using a redundant line. In particular, as illustrated in FIG. 5, a blanket reactive ion etch (RIE) or a blanket wet etch is performed on the metal stripe, e.g., copper, to remove a portion of the thickness of metal line MQ to form metal line MQ'. However, the portion of barrier layer 20 lying adjacent the removed thickness is not removed, such that a trench 21 is formed between facing portions of barrier layer 20 and between an upper surface of metal line MQ' and the upper surface of interlevel layer 15/hardmask 16. Trench 21 can be up to one-half of the thickness of metal line MQ, may be at least 100 angstroms, and preferably, is between 10-30% of the thickness of metal line MQ.

Figure 6:
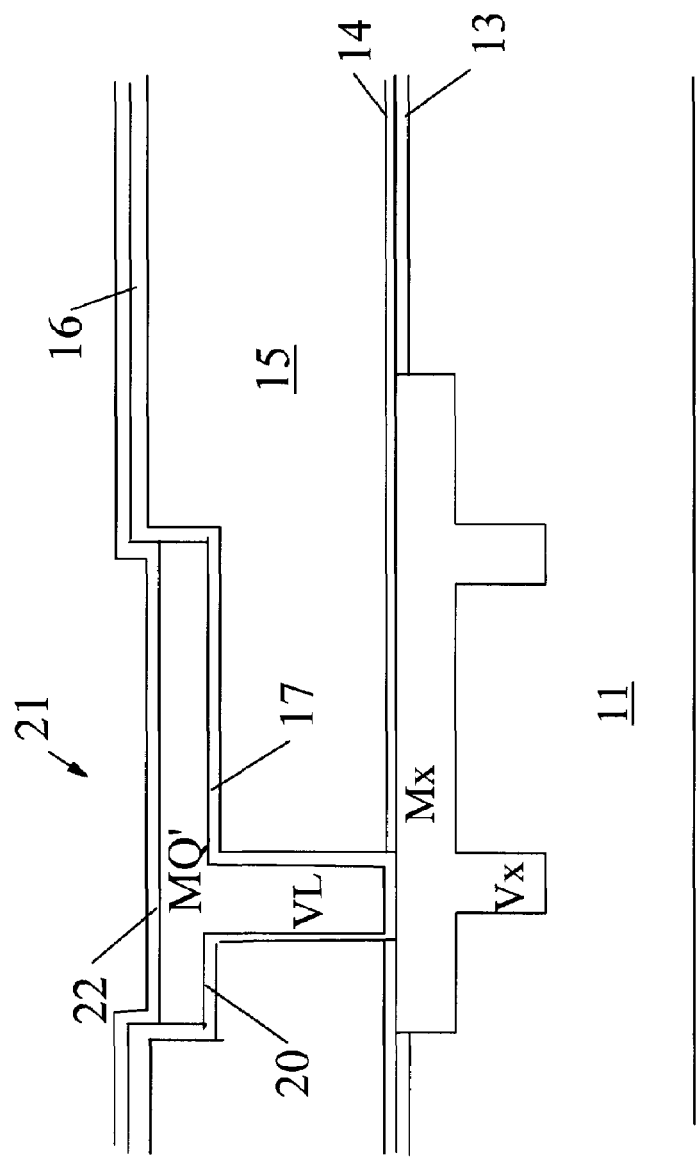

After formation of trench 21, a barrier layer (redundant liner) 22, as shown in FIG. 6, is deposited onto the surface of interlevel layer 15/hardmask 16, as well as into and along the sides of trench 21. Barrier layer 22 can have a thickness of 50-500 angstroms, preferably 50-100 angstroms, and be formed of, e.g., Ta, TaN, W, Ti, TiN, or other suitable material to act as a diffusion barrier layer for the metal to be deposited in barrier layer 22. Moreover, layer 22 can be formed from one or more of the identified materials. Thereafter, a metal, e.g., copper, is deposited into trench 21, and more particularly into barrier layer 22, in order to form metal line MQ".

Figure 7:
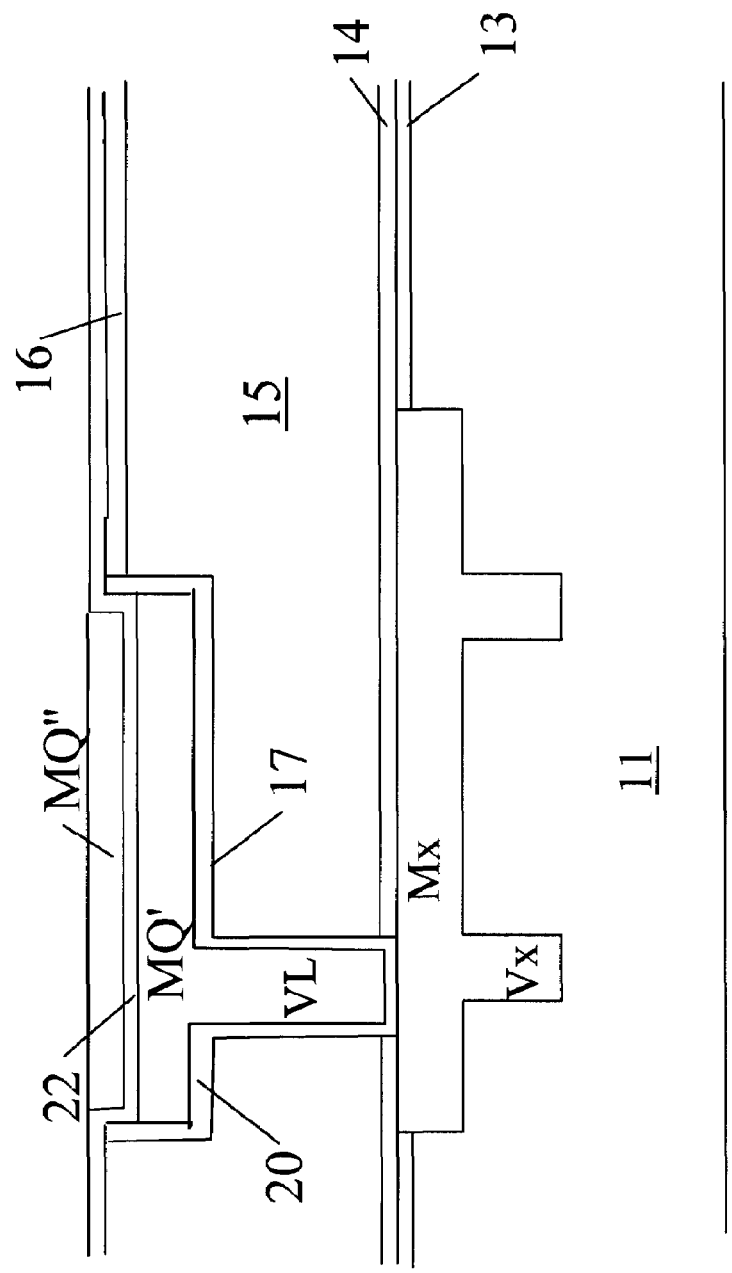

As shown in FIG. 7, a wiring line is patterned by removing excess metal from metal line MQ' and portions of barrier layer 22 from the upper surface of substrate 15 or optional hardmask 16, e.g., through chemical mechanical polishing, to achieve a smooth upper surface with a metal stripe. Thus, barrier layer 22 forms a redundant layer in the middle of the fatwire, i.e., between metal lines MQ' and MQ".

Figure 8:
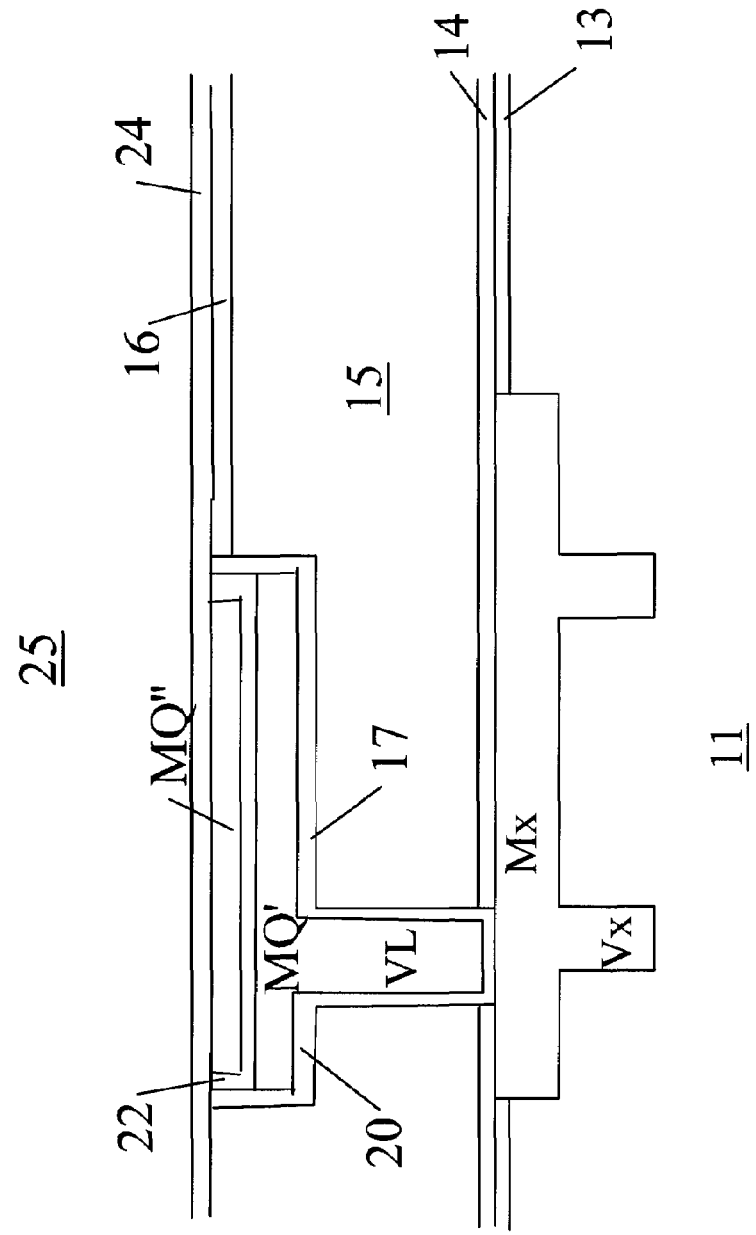

In a next production step, as illustrated in FIG. 8, a cap layer 24 is applied over the top of substrate 15/hardmask 16 and the metal stripe patterned from metal line MQ". Cap layer 24 can be, e.g., SiNx, SiCNH, or other suitable cap layer material for metal line Mx, and have a thickness of 200-1000 angstroms. A substrate or interlevel layer 25 is deposited onto cap layer 24. Interlayer 25, like substrates 11 and 15, can be, e.g., $SiO_2$, a low K organic material, a PCVD low k-dielectric material or other suitable material having a thickness of 5000 to 24000 angstroms. Again, an optional hardmask layer (not shown) can be deposited onto the surface of interlevel layer 25 in the manner set forth above.

Figure 9:
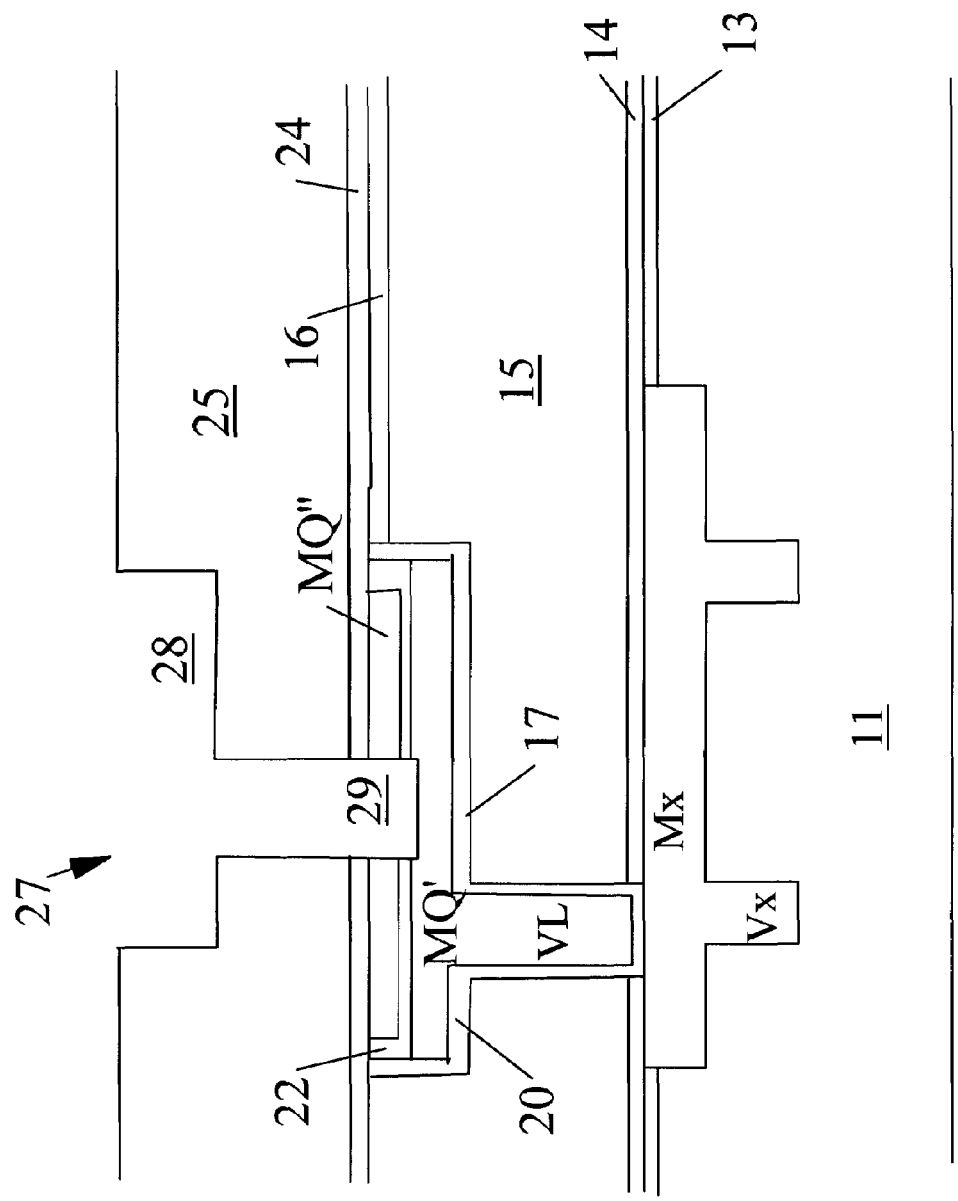
Figure 10:
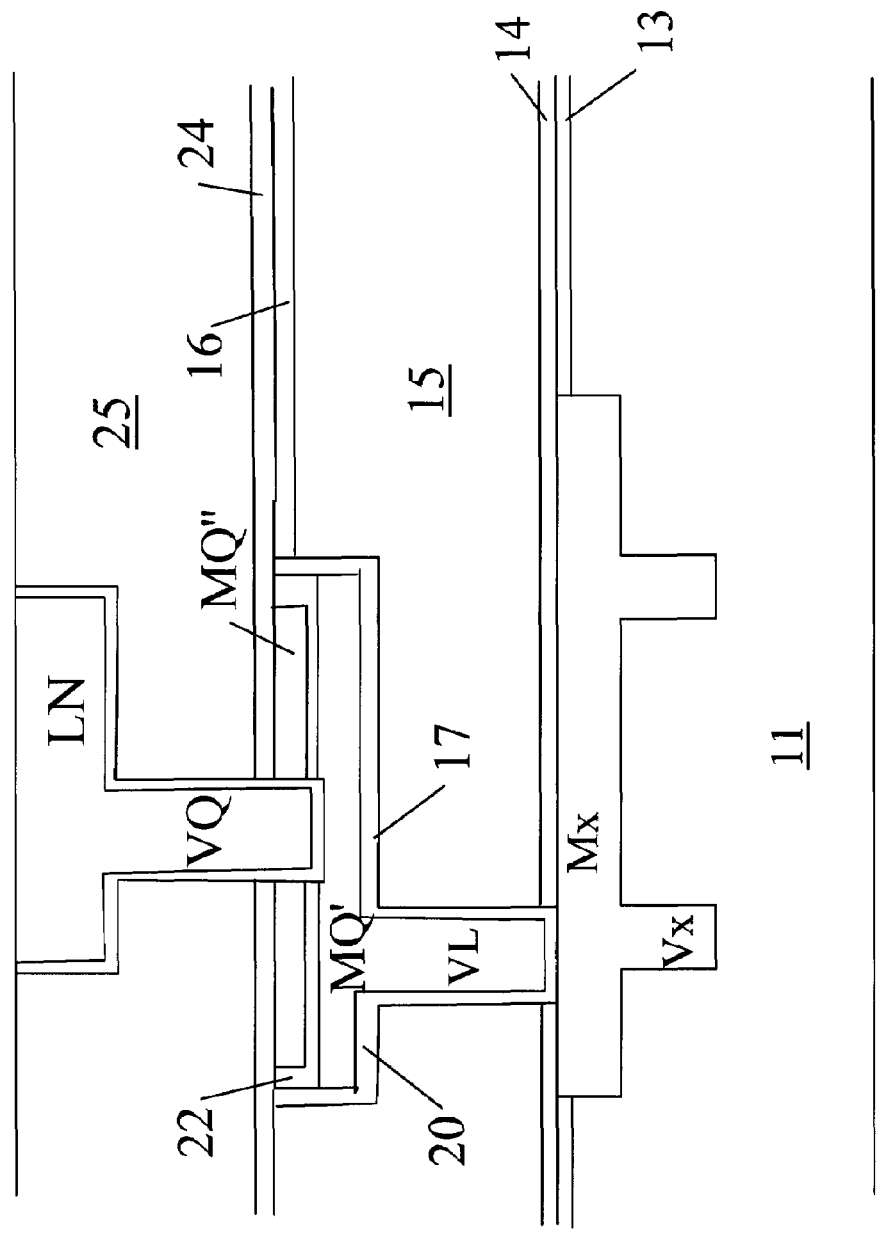

As illustrated in FIG. 9, a trench 27 is formed in interlevel layer 25, e.g., by lithography and etching, and is composed of two portions: a first portion 28 extending to a depth of 0.6-2 microns from the surface of interlevel layer 25 and a second portion 29 extending from first portion 28 down through at least barrier (redundant) layer 22 in order to create the desired redundance. Subsequently, a layer (liner) is deposited into trench 27, followed by deposition of metal into trench 27, or more specifically, into the liner within trench 27, in order to form metal line LN and via VQ, as shown in FIG. 10. Moreover, a portion of metal line LN can be etched so that a redundant liner can be placed within the etched portion, and then deposited with metal. The wiring line can be patterned by chemical mechanical polishing to provide a smooth surface and metal strip. This procedure can be repeated a number of time, e.g., 8-9 times, depending upon the particular interconnect design.

In this manner, via VQ is etched through cap layer 24, barrier layer 22, and into MQ'. Thus, via VQ can be, e.g., a depth deeper than one-half the thickness of the fatwire. Moreover, barrier layer 22 additionally forms a redundant layer between metal lines MQ' and LN.

As a result of this construction, barrier layer 22 will prevent any voids from underneath via VQ from propagating upward to metal line MQ". Further, the depth of via VQ will improve performance by increasing the contact surface around via V2, and improve reliability by having a longer lifetime and tighter sigma. This type of interconnect, in which the via VQ is deep into the fatwire will make the structure mechanically stronger, and, therefore, less prone to thermal cycle or stress migration failures due to the expansion or contraction of metal and the interlevel low k-dielectrics.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Moreover, the above-described method is used in the fabrication of integrated circuit chips.

While the invention has been described in terms of exemplary embodiments, those skilled in the art will recognize that the invention can be practiced with modifications and in the spirit and scope of the appended claims.

What is claimed is:

1. A method of fabricating a device, comprising:
   forming a trench in a metal stripe of a dual damascene line;
   depositing a barrier layer in the trench;
   filling a remainder of the trench with metal; and
   forming a second trench, wherein at least a portion of the second trench extends through the barrier layer.

2. The method in accordance with claim 1, wherein the forming of the trench comprises one of reactive ion etching and wet etching.

3. The method in accordance with claim 1, further comprising:
   polishing an upper surface of the metal filling the remainder of the trench to form a metal stripe in a smooth structure upper surface.

4. The method in accordance with claim 3, further comprising:
   depositing a cap layer over the smooth structure upper surface;
   depositing an interlevel layer over the cap layer, wherein the second trench is formed in the interlevel layer.

5. The method in accordance with claim 4, further comprising:
   depositing a second barrier layer in the second trench;
   filling a remainder of the second trench with metal; and
   polishing an upper surface of the metal filling the remainder of the second trench to form a second metal stripe in a second smooth structure upper surface.

6. The method in accordance with claim 5, further comprising:
depositing a second cap layer over the second smooth structure upper surface;
depositing a second interlevel layer over the second cap layer;
forming a third trench in the second interlevel layer, wherein at least a portion of the third trench extends through the second barrier layer;
depositing a second barrier layer in the third trench;
filling a remainder of the third trench with metal; and
polishing an upper surface of the metal filling the remainder of the third trench to form a metal stripe in a third smooth structure upper surface.

7. An interconnection structure formed according to the method of claim 1.

8. A method for fabricating an interconnect structure, comprising:
forming a trench in a substrate;
depositing metal in the trench;
forming a second trench in the metal;
depositing a redundant liner in the second trench;
depositing metal in the second trench; and
forming a third trench in which at least a portion of the third trench extends through the redundant liner.

9. The method in accordance with claim 8, further comprising:
depositing an interlevel layer over the substrate; and
forming the third trench in the interlevel layer.

10. The method in accordance with claim 9, further comprising depositing metal into the third trench.

11. The method in accordance with claim 10, wherein, prior to depositing the metal into the third trench, the method comprises depositing an interlevel layer barrier liner into the third trench.

12. A redundant structure formed in accordance with the method of claim 8.

* * * * *